United States Patent
Blank et al.

(10) Patent No.: US 12,168,301 B2
(45) Date of Patent: Dec. 17, 2024

(54) FIXTURE FOR AUTOMATIC CALIBRATION OF SUBSTRATE TRANSFER ROBOT

(71) Applicant: LAM RESEARCH CORPORATION, Fremont, CA (US)

(72) Inventors: Richard Blank, San Jose, CA (US); Aravind Alwan, Milpitas, CA (US); Behnam Behziz, Newark, CA (US); Peter Thaulad, San Jose, CA (US); Mark E. Emerson, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 432 days.

(21) Appl. No.: 17/435,020

(22) PCT Filed: Feb. 27, 2020

(86) PCT No.: PCT/US2020/020116
§ 371 (c)(1),
(2) Date: Aug. 30, 2021

(87) PCT Pub. No.: WO2020/180607
PCT Pub. Date: Sep. 10, 2020

(65) Prior Publication Data
US 2022/0134568 A1    May 5, 2022

Related U.S. Application Data

(60) Provisional application No. 62/813,371, filed on Mar. 4, 2019.

(51) Int. Cl.
*B25J 11/00*    (2006.01)
*B25J 9/16*    (2006.01)
*B25J 21/00*    (2006.01)

(52) U.S. Cl.
CPC .......... *B25J 9/1692* (2013.01); *B25J 9/1697* (2013.01); *B25J 11/0095* (2013.01); *B25J 21/005* (2013.01)

(58) Field of Classification Search
CPC .... B25J 9/1692; B25J 9/1697; B25J 11/0095; B25J 21/005; B25J 19/023;
(Continued)

(56) References Cited

U.S. PATENT DOCUMENTS 8,666,551 B2    3/2014    Takizawa et al.
9,405,287 B1 *    8/2016    Ravid .................. G05B 19/402
(Continued)

FOREIGN PATENT DOCUMENTS

CN    104201142 A    12/2014
CN    106783712 A    5/2017
(Continued)

OTHER PUBLICATIONS

International Search Report and Written Opinion of the ISA issued in PCT/US2020/020116, mailed Jun. 29, 2020; ISA/KR.
(Continued)

*Primary Examiner* — Khoi H Tran
*Assistant Examiner* — Tien Minh Le

(57) ABSTRACT

A robot calibration system includes a calibration fixture configured to be mounted on a substrate processing chamber. The calibration fixture includes at least one camera arranged to capture an image including an outer edge of a test substrate and an edge ring surrounding the test substrate. A controller is configured to receive the captured image, analyze the captured image to measure a distance between the outer edge of the test substrate and the edge ring, calculate a center of the test substrate based on the measured distance, and calibrate a robot configured to transfer sub-
(Continued)

strate to and from the substrate processing chamber based on the calculated center of the test substrate.

21 Claims, 8 Drawing Sheets

(58) Field of Classification Search
CPC ........ G05B 2219/39011; G01B 11/022; G01B 11/02; G01B 2210/56; H01L 21/67259; H01L 21/67742; H01L 21/681
See application file for complete search history.

(56) References Cited

U.S. PATENT DOCUMENTS

| | | | |
|---|---|---|---|
| 9,831,110 B2 | 11/2017 | Francken et al. | |
| 9,966,290 B2 | 5/2018 | Senn | |
| 2002/0037460 A1* | 3/2002 | Takahashi | G03F 7/70716 430/30 |
| 2003/0122093 A1 | 7/2003 | Schauer | |
| 2003/0186563 A1* | 10/2003 | Kobayashi | H01L 21/324 438/795 |
| 2004/0159773 A1* | 8/2004 | Fein | G01N 21/6458 250/208.1 |
| 2008/0013089 A1* | 1/2008 | Shii | G03F 9/7011 356/400 |
| 2008/0101912 A1 | 5/2008 | Martin et al. | |
| 2018/0138069 A1 | 5/2018 | Tan et al. | |
| 2018/0233396 A1* | 8/2018 | Matsushita | H01L 21/6838 |

FOREIGN PATENT DOCUMENTS

| | | |
|---|---|---|
| CN | 107240541 A | 10/2017 |
| CN | 107548518 A | 1/2018 |
| JP | 2004031396 A | 1/2004 |
| JP | 2005093667 A | 4/2005 |
| JP | 2018523288 A | 8/2018 |
| JP | 2018179728 A | 11/2018 |
| TW | 201802468 A | 1/2018 |

OTHER PUBLICATIONS

Taiwan Office Action for Taiwan Application No. 109106834 Nov. 29, 2023.
Chinese Office Action for Chinese Application No. CN202080018591.9 dated Jun. 27, 2024.
Japanese Office Action for Japanese Application No. JP2021-551544.9 dated Sep. 13, 2024.
Korean Office Action for Korean Application No. KR10-2021-7031740.9 dated Aug. 25, 2024.

* cited by examiner

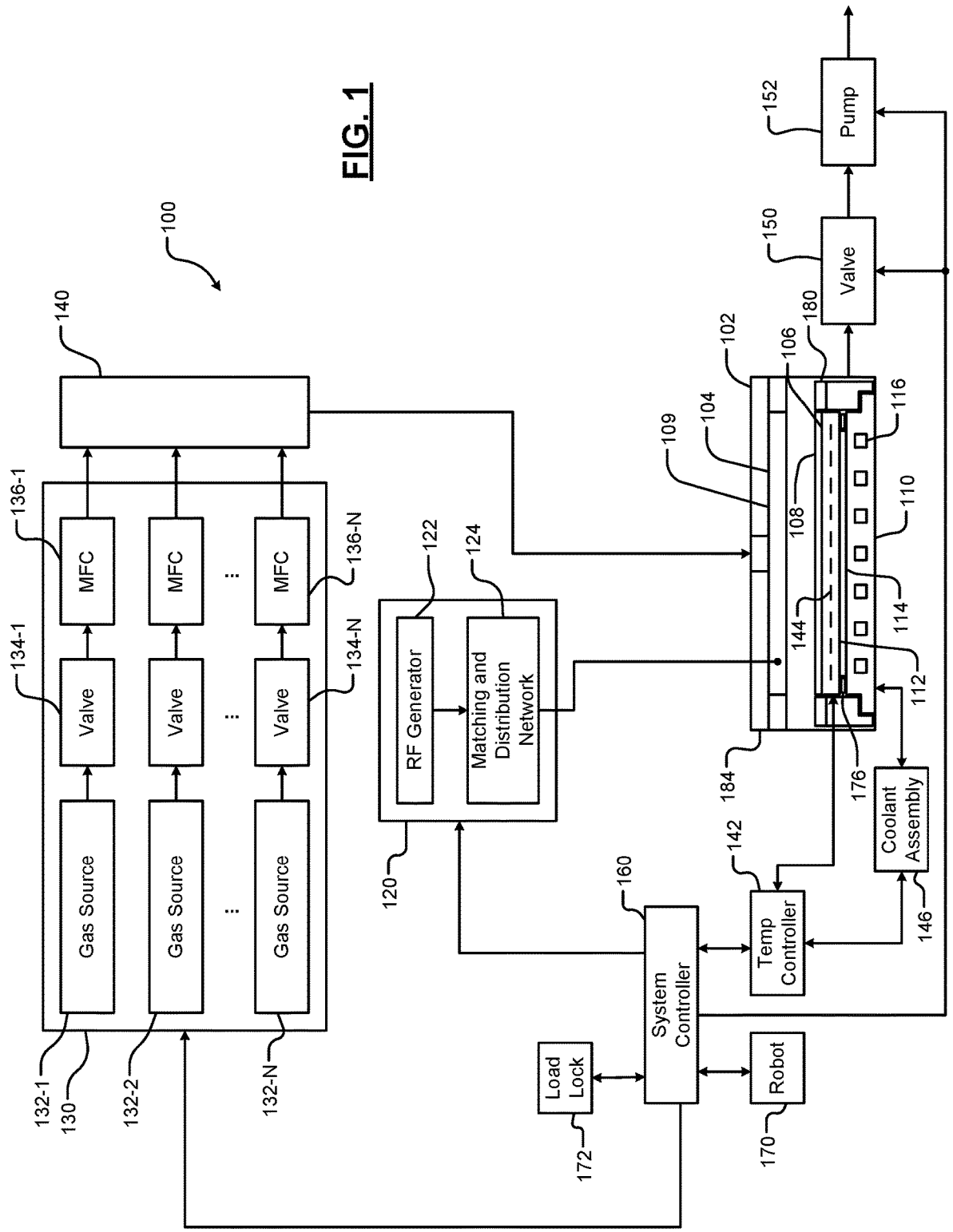

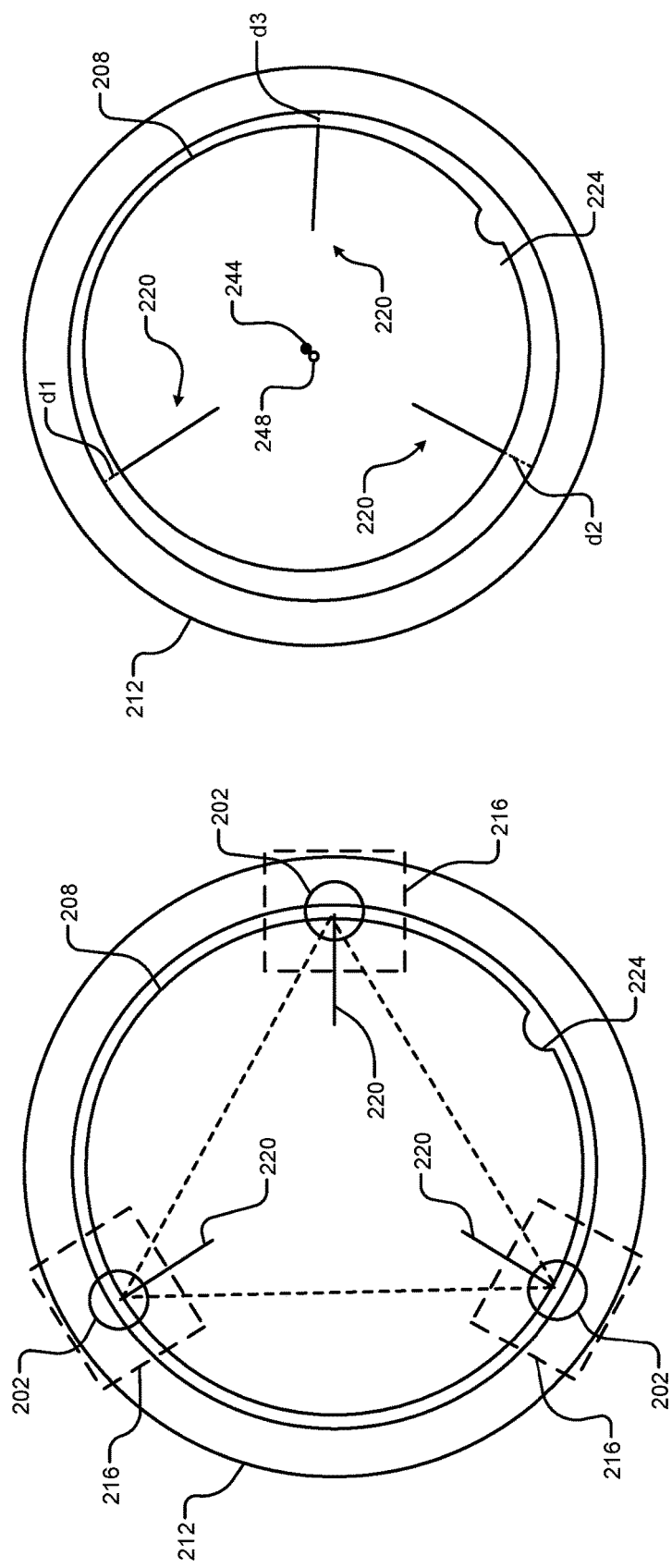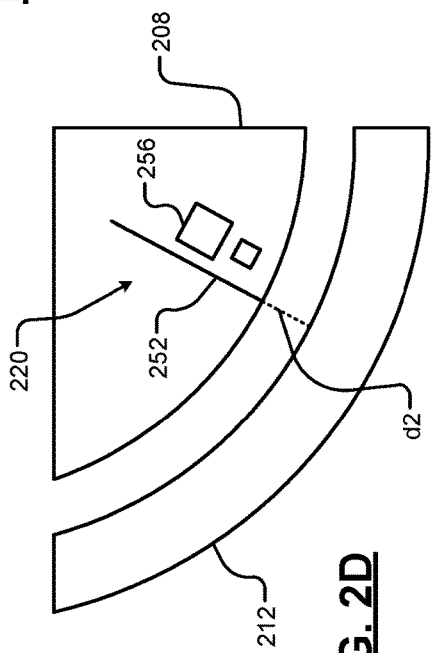

FIXTURE FOR AUTOMATIC CALIBRATION OF SUBSTRATE TRANSFER ROBOT

CROSS-REFERENCE TO RELATED APPLICATIONS

This application is a U.S. National Phase Application under 35 U.S.C. 371 of International Application No. PCT/US2020/020116, filed on Feb. 27, 2020, which claims the benefit of U.S. Provisional Application No. 62/813,371, filed on Mar. 4, 2019. The entire disclosures of the applications referenced above are incorporated herein by reference.

FIELD

The present disclosure relates to systems and methods for calibrating a robot in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

SUMMARY

A robot calibration system includes a calibration fixture configured to be mounted on a substrate processing chamber. The calibration fixture includes at least one camera arranged to capture an image including an outer edge of a test substrate and an edge ring surrounding the test substrate. A controller is configured to receive the captured image, analyze the captured image to measure a distance between the outer edge of the test substrate and the edge ring, calculate a center of the test substrate based on the measured distance, and calibrate a robot configured to transfer substrate to and from the substrate processing chamber based on the calculated center of the test substrate.

In other features, the at least one camera corresponds to three cameras. The robot calibration system includes a seal compressed between the calibration fixture and the substrate processing chamber and the controller is configured to pump the substrate processing chamber down to vacuum while the calibration fixture is mounted on the substrate processing chamber. The controller is configured to control the at least one camera to capture the image while the substrate processing chamber is at vacuum.

In other features, the controller is configured to determine a width of pixels in a field of view of the at least one camera and measure the distance between the outer edge of the test substrate and the edge ring based on the determined width of the pixels. The test substrate includes at least one reference marking located in the field of view of the at least one camera, the at least one reference marking has a known dimension, and the controller is configured to determine the width of the pixels based on the known dimension. The at least one reference marking is a square and the known dimension is a width of the square.

In other features, the test substrate includes a reference line aligned with a radius of the test substrate and the controller is configured to measure the distance between the outer edge of the test substrate and the edge ring at a location corresponding to the reference line. The controller is configured to calculate a correction amount based on the calculated center of the test substrate and update the coordinates of the robot based on the correction amount. The controller is configured to calculate the correction amount based on an offset between the calculated center of the test substrate and a center of the edge ring. The robot is calibrated by updating a plurality of coordinates of the robot.

A method for calibrating a robot configured to transfer substrates to and from a substrate processing chamber having a calibration fixture having at least one camera mounted on the substrate processing chamber includes capturing an image including an outer edge of a test substrate and an edge ring surrounding the test substrate using the at least one camera. The method further includes analyzing the captured image to measure a distance between the outer edge of the test substrate and the edge ring, calculating a center of the test substrate based on the measured distance, and calibrating a robot configured to transfer substrates to and from the substrate processing chamber based on the calculated center of the test substrate.

In other features, the at least one camera corresponds to three cameras. The method further includes pumping the substrate processing chamber down to vacuum. The method further includes controlling the at least one camera to capture the image while the substrate processing chamber is at vacuum.

In other features, the method further includes determining a width of pixels in a field of view of the at least one camera and measuring the distance between the outer edge of the test substrate and the edge ring based on the determined width of the pixels. The test substrate includes at least one reference marking located in the field of view of the at least one camera, the at least one reference marking has a known dimension, and the width of the pixels is determined based on the known dimension. The at least one reference marking is a square and the known dimension is a width of the square.

In other features, the test substrate includes a reference line aligned with a radius of the test substrate and the distance between the outer edge of the test substrate and the edge ring is measured at a location corresponding to the reference line. The method further includes calculating a correction amount based on the calculated center of the test substrate and calibrating the robot based on the correction amount. The method further includes calculating the correction amount based on an offset between the calculated center of the test substrate and a center of the edge ring.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of an example substrate processing system according to the present disclosure;

FIGS. 2A, 2B, 2C, and 2D illustrate an example calibration fixture and robot calibration system according to the present disclosure;

In the drawings, reference numbers may be reused to identify similar and/or identical elements.

DETAILED DESCRIPTION

Figure 2A:
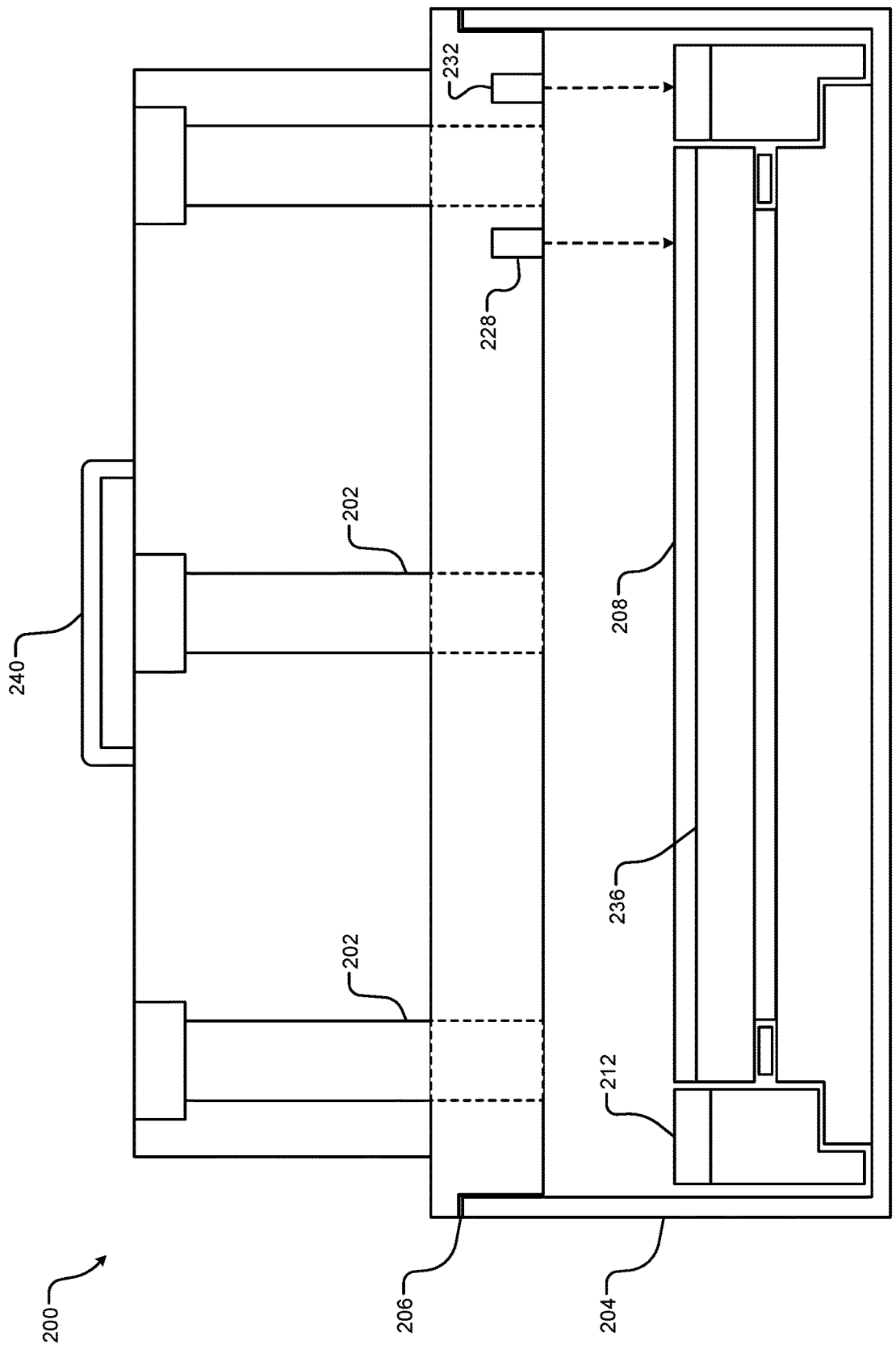

In substrate processing systems, a robot/handler (e.g., a vacuum transfer module, or VTM, robot) may be used to transfer substrates to and from a substrate support within a processing chamber. Some substrate processing systems may implement a dynamic alignment system for aligning substrates on the substrate support using a robot. The substrate is aligned on the pedestal to allow accurate capture and/or transfer of the substrate (e.g., to a process cell) using a robot or other tool. Alignment of the substrate may be achieved using a notch formed in an outer edge of the substrate. Various types of substrate aligners may be used to detect a position of the notch as the substrate is rotated. For example, a sensor may detect the notch as the substrate is slowly rotated using the chuck. A notch location and substrate offset are calculated based on the detected notch and provided to the robot.

The robot may be further configured to transfer edge rings to and from the substrate support. The robot may be controlled according to predetermined calibration data to center the edge ring on the substrate support. Accurate placement of the edge ring on the substrate support may be difficult. For example, a desired position of the edge ring may be a centered position relative to the substrate support. In some examples, the robot may be configured to transfer the edge ring to a predetermined, known centered position relative to the substrate support. However, replacement of components of the substrate support, maintenance within the processing chamber, etc. may cause a center position of the substrate support to change.

Accordingly, the robot must be periodically calibrated to achieve accurate placement of transferred substrates, edge rings, and/or other components of a substrate processing system. Conventional robot calibration methods may be prone to human error and system and/or process variations, such as vacuum deflections.

Robot calibration systems and methods according to the present disclosure provide a robot calibration fixture configured to measure a distance between a substrate (e.g., a test substrate) arranged on the substrate support and an edge ring and calibrate the robot accordingly. For example, robot calibration fixture may include three or more imaging devices (e.g., cameras) arranged to measure the distance from an edge of the test substrate to an edge (e.g., an inner edge) of the edge ring. In one example, the robot calibration fixture includes three cameras mounted in a triangular arrangement. The test substrate may include reference markings to facilitate a calculation of the position of the test substrate relative to the substrate. Based on the calculation of the position of the test substrate relative to the edge ring, the system is configured to calculate adjustment information and control the robot to retrieve and replace the test substrate. The retrieval and replacement may be repeated iteratively until the test substrate is in a desired position to complete the calibration of the robot.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end configured to receive process gases. A base portion is generally cylindrical and extends radially outwardly from an opposite end of the stem portion at a location that is spaced from the top surface of the processing chamber 102. A substrate-facing surface or faceplate of the base portion of the showerhead 109 includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, ..., and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements 144, such as thermal control elements (TCEs) arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 may be moveable (e.g., moveable upward and downward in a vertical direction) relative to the substrate support 106. For example, the edge ring 180 may be controlled via an actuator and lift pins responsive to the system controller 160. In some examples, the system controller 160 and the robot 170 may be further configured to retrieve and replace the edge ring 180.

The system controller 160 according to the present disclosure is configured to perform calibration of the robot 170 as described below in more detail. For example, the processing chamber 102 may include a removable lid 184. The lid 184 and the showerhead 109 may be separately removable. In some examples, the showerhead 109 or other upper electrode and gas distribution device may be integrated within the lid 184 such that when the lid 184 is removed, the showerhead 109 is also removed from the processing chamber 102. During calibration of the robot 170, a calibration fixture (not shown in FIG. 1; described below in more detail) including imaging devices (e.g., cameras) is mounted on the processing chamber 102. The imaging devices are arranged to measure a distance between the substrate 108 (e.g., a test substrate) and the edge ring 180 and calibrate the robot 170 accordingly.

Referring now to FIGS. 2A, 2B, and 2C and with continued reference to FIG. 1, an example calibration fixture 200 according to the present disclosure includes a plurality of imaging devices, such as cameras 202. For example, each of the cameras 202 may correspond to a high-resolution charge-coupled device, or CCD, camera array. In this example, the calibration fixture 200 includes three of the cameras 202 arranged 120 degrees apart as shown in a plan view in FIG. 2B.

The calibration fixture 200 is configured to be mounted on a processing chamber 204 to replace the lid 184 to perform calibration of the robot 170. The calibration fixture 200 may be sealed against the processing chamber 204 using a seal (e.g., an O-ring) 206. The processing chamber 204 may be pumped down to vacuum or other another desired pressure for calibration. For example, the processing chamber 204 is pumped down to a vacuum pressure consistent with pressures in the processing chamber 204 during processing of substrates therein. Accordingly, measurements for performing calibration are taken while the processing chamber 204 is at vacuum and any structural deviations caused by vacuum pressure (e.g., vacuum deflection of various components and surfaces within the processing chamber 204) are present. In this manner, the calibration of the robot 170 according to the present disclosure corresponds more accurately to the conditions of the processing chamber 204 during actual transfer of substrates to and from the processing chamber 204 for processing.

The cameras 202 are each positioned to capture an image of an outer edge of a test substrate 208 and an inner edge of an edge ring 212 in a respective camera field of view (FOV) 216. For example only, the FOV 216 of each of the cameras 202 is an 18×22 mm rectangle. The captured images are then analyzed (e.g., by the system controller 160) to determine a distance between the edges of the test substrate 208 and the edge ring 212 in each image. The test substrate 208 may comprise a same material (e.g., silicon) as substrates to be processed in the processing chamber 204. Accordingly, characteristics of the test substrate 208 under vacuum, a weight and surface friction, etc. are consistent with a typical substrate to be processed in the processing chamber 204. Although shown external to the calibration fixture 200 and the cameras 202, in some examples the system controller 160 and or dedicated functional components of the system controller 160 may be integrated within one or more of the cameras 202, the calibration fixture 200, etc.

In some examples, the test substrate 208 may include one or more reference markings 220 (e.g., lines aligned with radii of the test substrate 208) to facilitate the analysis performed by the system controller 160. The test substrate 208 may further include a notch 224 for determining an alignment/orientation of the test substrate 208 using a suitable substrate alignment system.

The calibration fixture 200 may further include one or more measurement devices 228 and 232 for measuring distances between the calibration fixture 200 and the test substrate 208 (and/or an upper surface of the substrate support 236) and the edge ring 212, respectively. For example, the measurement devices 228 and 232 may implement laser transmitting and sensor systems. The system controller 160 may adjust the measurements performed for the calibration of the robot 170 to account for changes in heights of the substrate support 236 and/or the edge ring 212, tilt, etc. In some examples, the calibration fixture 200 may include a handle 240 to facilitate mounting and removal of the calibration fixture 200.

The test substrate 208 is shown in a non-centered position relative to the edge ring 212 in FIG. 2C. The cameras 202 capture images in the respective FOVs 216 and the system controller 160 analyzes the images to determine distances d1, d2, and d3 between respective points on the outer perimeter the test substrate 208 and the edge ring 212. In one example, the system controller 160 determines coordinates (e.g., x, y coordinates) of the respective points on the outer perimeter of the test substrate 208. For example, if the cameras 202 are arranged in known fixed positions in the calibration fixture 200, the respective FOVs 216 of the cameras 202 correspond to known portions of an x, y coordinate system. In other words, the distances d1, d2, and d3 are measured and therefore corresponding coordinates of three points on an outer edge of the test substrate 208 can be readily determined. The system controller 160 may then calculate a center 244 (e.g., x, y coordinates) of a circle corresponding to the test substrate 208 based on the distances d1, d2, and d3 and the coordinates of the respective points. For example, the coordinates x, y of the center 244 are calculated in accordance with (x, y)=f(d1, d2, d3), where f(d1, d2, d3) corresponds to any function for calculating the center of a circle using three known points on the circle.

A center 248 of the edge ring 212 may be known (and/or calculated in a similar manner as the center 244 of the test substrate 208). The system controller 160 calculates a correction amount dR, dT based on a difference between the coordinates x, y of the center 244 of the test substrate and the center 248 of the edge ring 212. For example, the correction amount dR, dT may be calculated in accordance with (dR, dT)=f(x, y, R, T), where R, T corresponds to a target center position in a robot coordinate system. In other words, the system controller 160 correlates the difference between the coordinates x, y of the center 244 of the test substrate and the center 248 of the edge ring 212 to the correction amount dR, dT to be applied to the target center position R, T of the robot 170. The system controller 160 provides the corrected R, T coordinates to the robot 170. The robot 170 can then retrieve the test substrate 208 and replace the test substrate 208 on the substrate support using the corrected R, T coordinates. The determination of the center 244 of the test substrate 208, correction of the R, T coordinates, and retrieval and replacement of the test substrate 208 can be repeated until the center 244 of the test substrate 208 matches the center 248 of the edge ring 212.

In examples where the test substrate 208 includes the reference markings 220, the system controller 160 is configured to analyze captured images within the respective FOVs 216 to compensate for mechanical tolerances related to relative positioning of the calibration fixture 200, the cameras 202, the edge ring 212, etc. Example reference markings 220 including a reference line 252 and reference squares 256 are shown in FIG. 2D. The reference lines 252 correspond to lines on respective radii of the test substrate 208. Accordingly, the reference lines 252 intersect with the center 244 of the test substrate 208. The system controller 160 analyzes the captured images to identify the reference lines 252 and measure the respective distances d from the end points of the reference lines 252 at the edge of the test substrate 208 to the edge ring 212. The system controller calculates the center 244 of the test substrate 208 (e.g., in an x, y coordinate system) based on the identified locations of the reference lines 252 and the measured distances d1, d2, and d3.

The reference squares 256 are provide to calibrate a pixel size of the cameras 202 within the respective FOVs 216. For example, the reference squares 256 have a known width (e.g., 1×1 mm, 2×2 mm, etc.). As shown, the reference squares 256 include a 1×1 mm square and a 2×2 mm square. In other examples, more than two of the reference squares 256 may be provided. Further, shapes other than the reference squares 256 may be used.

The system controller 160 analyzes the captured images to determine a number of pixels in the widths of the respective reference squares 256. Since the sizes of the reference squares 256 are known, a width of an individual pixel can be determined accordingly. For example, if a 1×1 mm reference square includes 116.46 pixels, the width of one pixel can be calculated as 1,000/116.46, or 8.587 microns. Similarly, if a 2×2 mm reference square includes 234.313 pixels, the width of one pixel can be calculated as 2,000/234.313, or 8.536 microns. The distances d1, d2, and d3 may then be accurately measured based on the calculated width per pixel.

Figure 3:
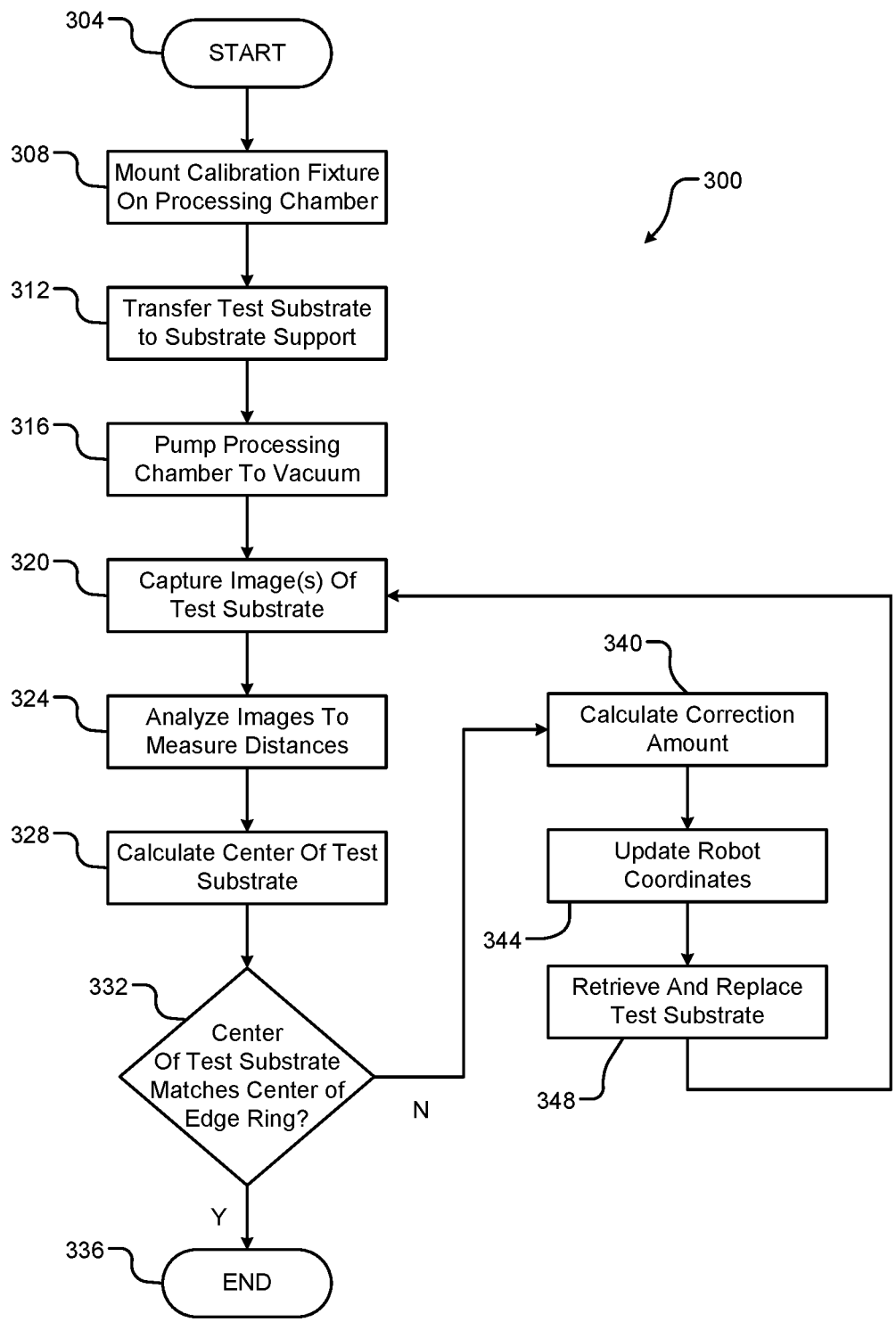
FIG. 3 illustrates steps of an example method for calibrating a robot according to the present disclosure.

Referring now to FIG. 3, an example method 300 for calibrating a robot for a substrate processing system begins at 304. At 308, a calibration fixture is mounted on a processing chamber. For example, the calibration fixture includes one or more cameras arranged to capture an image of a region of the processing chamber including an edge of a test substrate and an edge ring. At 312, the test substrate is transferred to a substrate support in the processing chamber using a robot. At 316, the processing chamber is pumped down to a vacuum pressure. At 320, the calibration fixture (e.g., responsive to a controller, such as the system controller 160) captures one or more images of an edge of the test substrate and an adjacent edge of the edge ring. For example only, the calibration fixture captures three of the images using respective cameras.

At 324, the method 300 (e.g., using the system controller 160) analyzes the captured images to determine distances between the edge of the test substrate and the edge ring. At 328, the method 300 (e.g., using the system controller 160) determines a center of the test substrate based on the determined distances. For example, the method 300 determines coordinates (e.g., in an x-y plane) of three points on the edge of the test substrate based on the determined distances and calculates the center of the test substrate accordingly. At 332, the method 300 (e.g., the system controller 160) determines whether the calculated center of the test substrate matches a center of the edge ring. If true, the method 300 determines that calibration of the robot is complete and ends at 336. If false, the method 300 continues to 340.

At 340, the method 300 (e.g., using the system controller 160) determines a correction amount dR, dT to correct R, T coordinates of the robot corresponding to a nominal center point. For example, the method 300 determines the correction amount dR, dT based on a difference between the calculated center of the test substrate and a center of the edge ring. At 344, the method 300 updates the R, T coordinates of the robot in accordance with the determined correction amount. At 348, the method 300 (e.g., the system controller 160) controls the robot to retrieve and replace the test substrate using the corrected R, T coordinates. The method 300 then continues to 320 to repeat steps 320 through 332 until calibration is complete (i.e., until the calculated center of the test substrate matches the center of the edge ring).

Figure 4A:
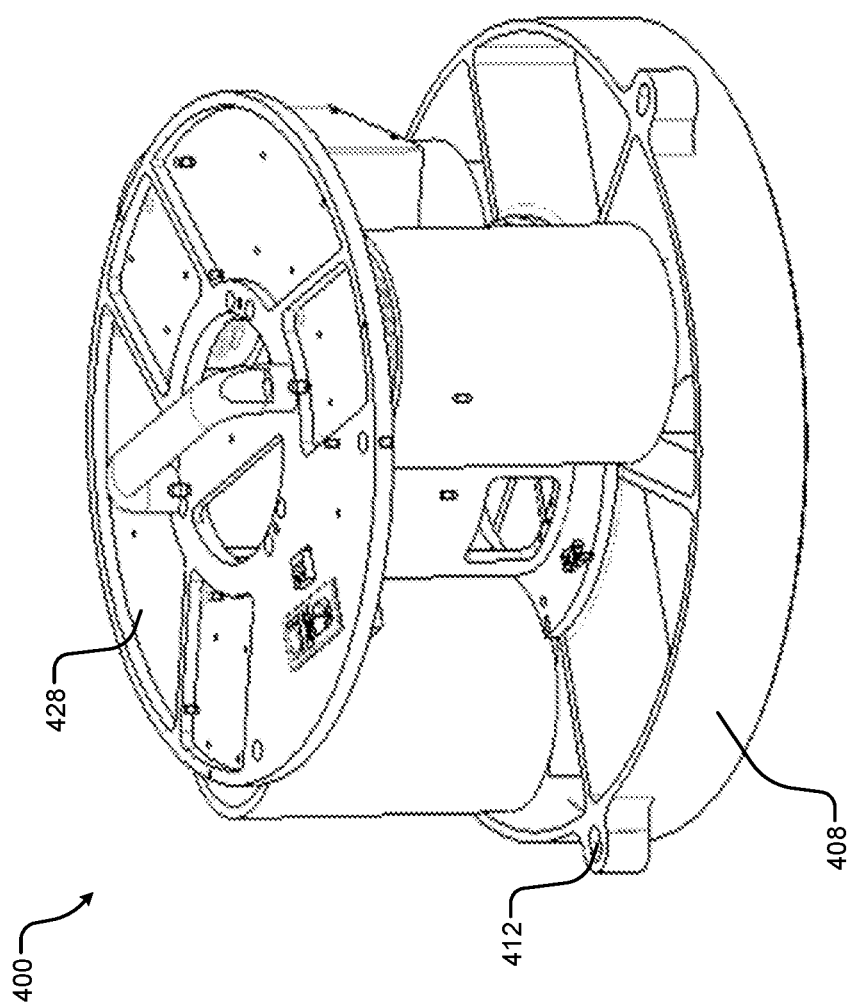
FIGS. 4A, 4B, 4C, and 4D show views of an example calibration fixture according to the present disclosure.
Figure 4B:
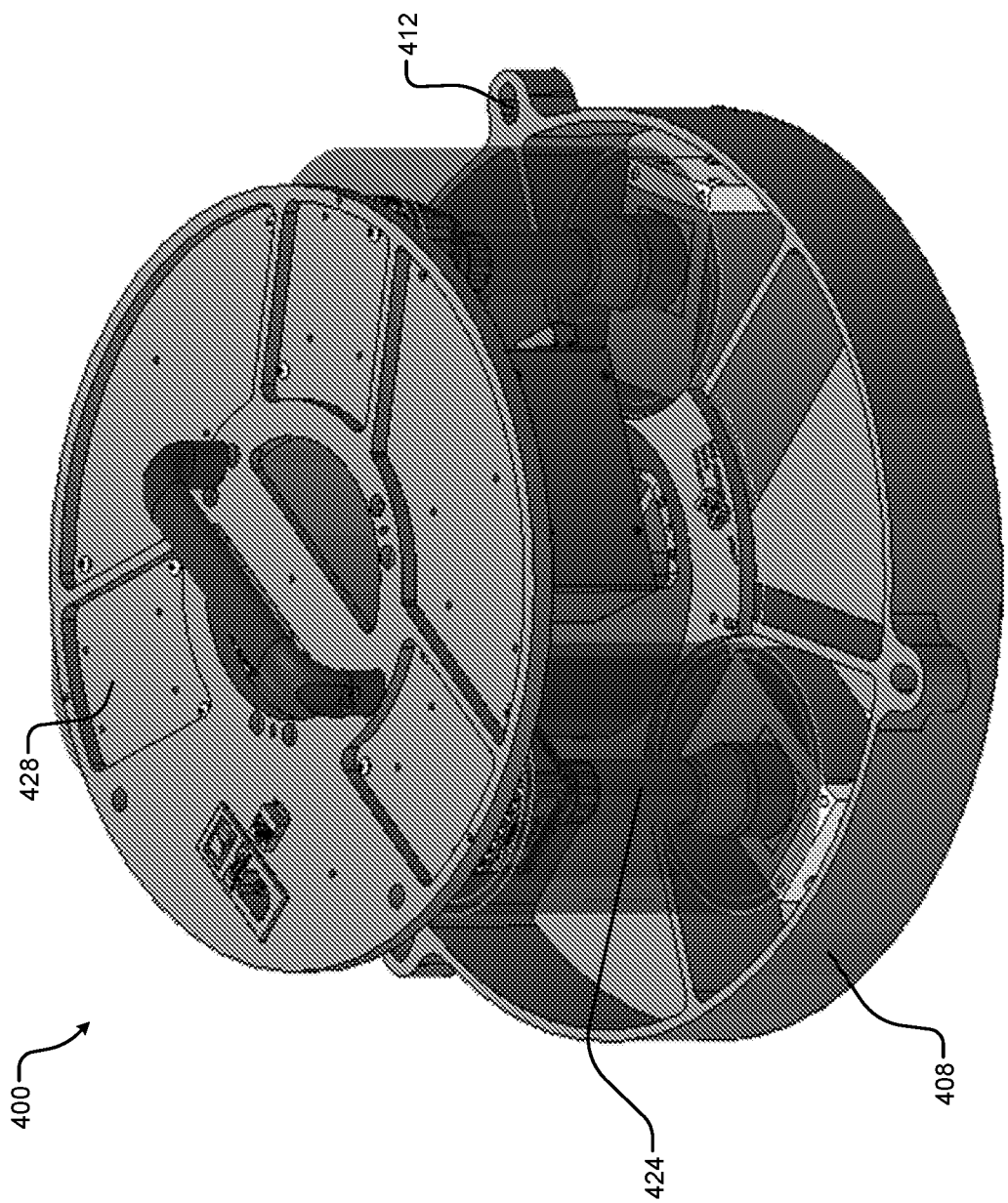
Figure 4C:
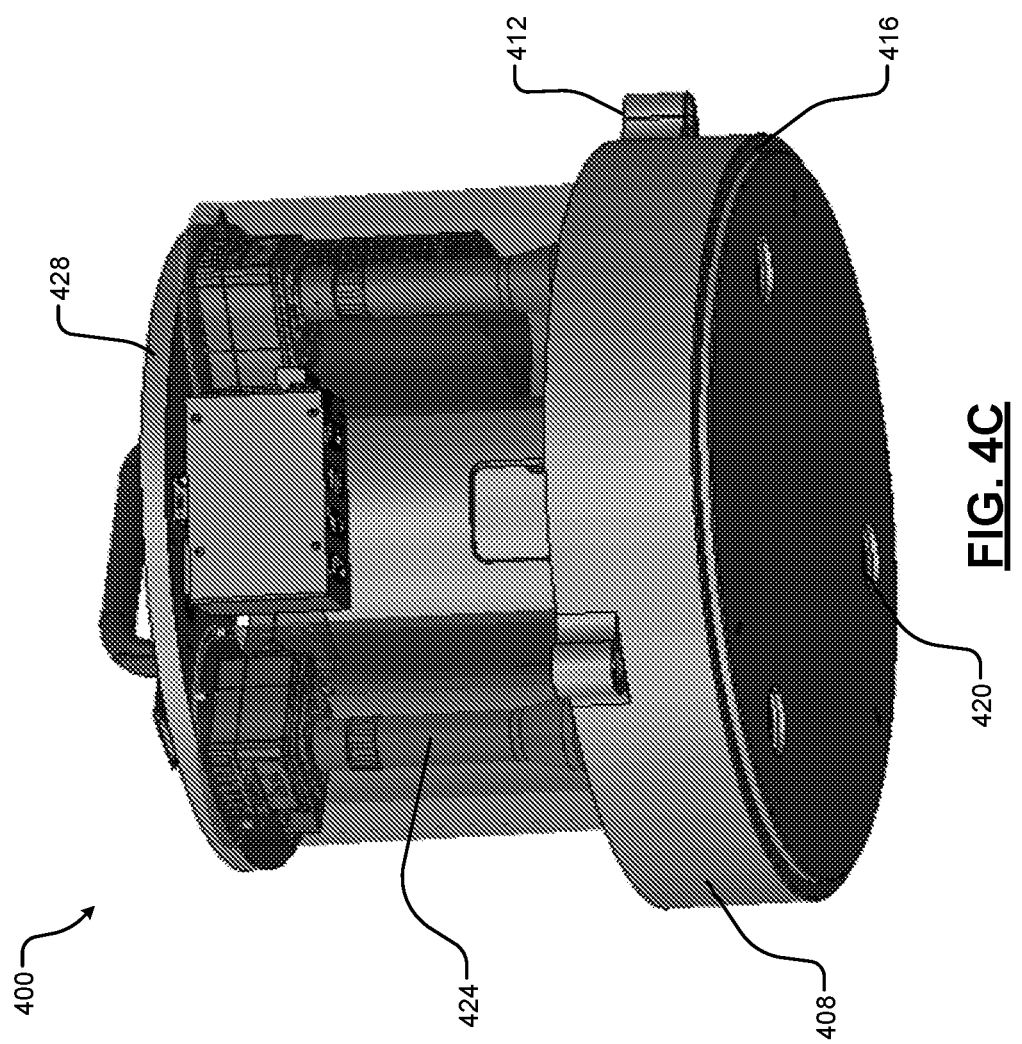
Figure 4D:
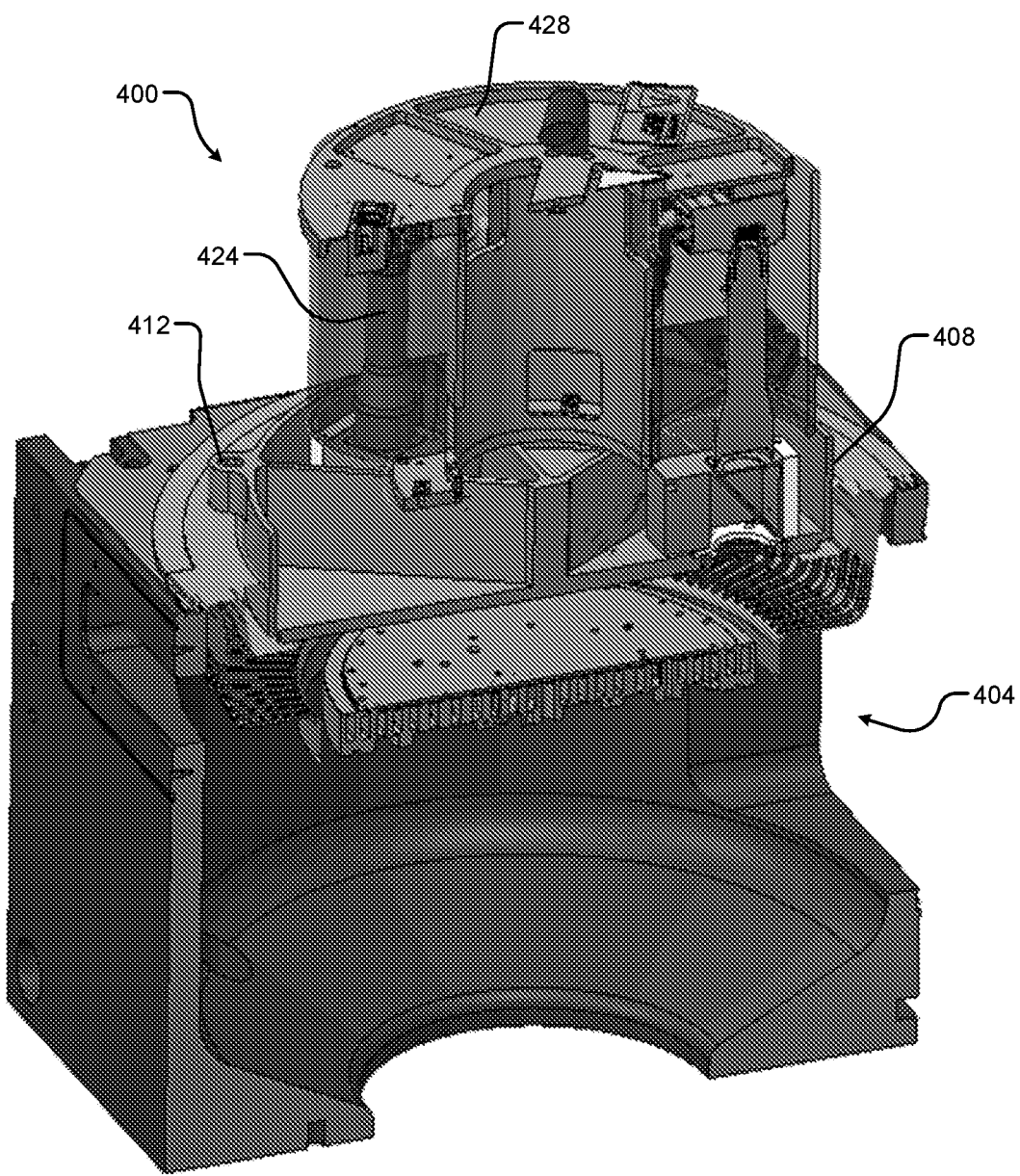

Referring now to FIGS. 4A, 4B, 4C, and 4D, views of an example calibration fixture 400 according to the present disclosure are shown. In FIG. 4D, the calibration fixture 400 is shown mounted on an example processing chamber 404. The calibration fixture 400 includes a bottom cover plate 408 configured to mount to an upper end of the processing chamber 404. For example, the cover plate 408 may include bolt holes configured to align with respective holes in the processing chamber 404 and receive mounting bolts. The cover plate 408 may include a recessed groove 416 configured to compress and retain an annular seal, such as an O-ring, between the cover plate 408 and the processing chamber 404. A bottom surface of the cover plate 408 includes openings 420 corresponding to respective ones of cameras 424. The cameras 424 are arranged between the bottom cover plate 408 and an upper plate 428 of the calibration fixture 400.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A robot calibration system, comprising:
   a calibration fixture configured to be mounted on a substrate processing chamber, wherein the calibration fixture includes at least one camera arranged to capture an image including an outer edge of a test substrate and an edge ring surrounding the test substrate; and
   a controller configured to receive the captured image, analyze the captured image to measure a distance between the outer edge of the test substrate and the edge ring, calculate a center of the test substrate based on the measured distance, and calibrate a robot configured to transfer substrate to and from the substrate processing chamber based on the calculated center of the test substrate.

2. The robot calibration system of claim 1, wherein the at least one camera corresponds to three cameras.

3. The robot calibration system of claim 1, wherein the robot calibration system includes a seal compressed between the calibration fixture and the substrate processing chamber, and wherein the controller is configured to pump the substrate processing chamber down to vacuum while the calibration fixture is mounted on the substrate processing chamber.

4. The robot calibration system of claim 3, wherein the controller is configured to control the at least one camera to capture the image while the substrate processing chamber is at vacuum.

5. The robot calibration system of claim 1, wherein the controller is configured to determine a width of pixels in a field of view of the at least one camera and measure the distance between the outer edge of the test substrate and the edge ring based on the determined width of the pixels.

6. The robot calibration system of claim 5, wherein the test substrate includes at least one reference marking located in the field of view of the at least one camera, wherein the at least one reference marking has a known dimension, and wherein the controller is configured to determine the width of the pixels based on the known dimension.

7. The robot calibration system of claim 6, wherein the at least one reference marking is a square and the known dimension is a width of the square.

8. The robot calibration system of claim 1, wherein the test substrate includes a reference line aligned with a radius of the test substrate, and wherein the controller is configured to measure the distance between the outer edge of the test substrate and the edge ring at a location corresponding to the reference line.

9. The robot calibration system of claim 1, wherein the controller is configured to calculate a correction amount based on the calculated center of the test substrate and calibrate the robot based on the correction amount.

10. The robot calibration system of claim 9, wherein the controller is configured to calculate the correction amount based on an offset between the calculated center of the test substrate and a center of the edge ring.

11. The robot calibration system of claim 1, wherein the robot is calibrated by updating a plurality of coordinates of the robot.

12. A method for calibrating a robot configured to transfer substrates to and from a substrate processing chamber, the substrate processing chamber having a calibration fixture mounted thereon, the calibration fixture having at least one camera, the method comprising:
    capturing an image including an outer edge of a test substrate and an edge ring surrounding the test substrate using the at least one camera;
    analyzing the captured image to measure a distance between the outer edge of the test substrate and the edge ring;
    calculating a center of the test substrate based on the measured distance; and
    calibrating the robot based on the calculated center of the test substrate.

13. The method of claim 12, wherein the at least one camera corresponds to three cameras.

14. The method of claim 12, further comprising pumping the substrate processing chamber down to vacuum.

15. The method of claim 14, further comprising controlling the at least one camera to capture the image while the substrate processing chamber is at vacuum.

16. The method of claim 12, further comprising determining a width of pixels in a field of view of the at least one camera and measuring the distance between the outer edge of the test substrate and the edge ring based on the determined width of the pixels.

17. The method of claim 16, wherein the test substrate includes at least one reference marking located in the field of view of the at least one camera, wherein the at least one reference marking has a known dimension, and wherein the width of the pixels is determined based on the known dimension.

18. The method of claim 17, wherein the at least one reference marking is a square and the known dimension is a width of the square.

19. The method of claim 12, wherein the test substrate includes a reference line aligned with a radius of the test substrate, and wherein the distance between the outer edge of the test substrate and the edge ring is measured at a location corresponding to the reference line.

20. The method of claim 12, further comprising calculating a correction amount based on the calculated center of the test substrate and calibrating the robot based on the correction amount.

21. The method of claim 20, further comprising calculating the correction amount based on an offset between the calculated center of the test substrate and a center of the edge ring.

* * * * *